(12) United States Patent
Yan et al.

(10) Patent No.: US 11,289,395 B2
(45) Date of Patent: Mar. 29, 2022

(54) APERTURE STRUCTURE ON SEMICONDUCTOR COMPONENT BACKSIDE TO ALLEVIATE DELAMINATION IN STACKED PACKAGING

(71) Applicant: Western Digital Technologies, Inc., San Jose, CA (US)

(72) Inventors: Junrong Yan, Minhang District (CN); Chee Keong Chin, Shanghai (CN); Xin Lu, Shanghai (CN)

(73) Assignee: Western Digital Technologies, Inc., San Jose, CA (US)

( * ) Notice: Subject to any disclaimer, the term of this patent is extended or adjusted under 35 U.S.C. 154(b) by 92 days.

(21) Appl. No.: 16/821,860

(22) Filed: Mar. 17, 2020

(65) Prior Publication Data

US 2020/0335481 A1 Oct. 22, 2020

(51) Int. Cl.
*H01L 23/31* (2006.01)
*H01L 25/065* (2006.01)
*H01L 21/50* (2006.01)
*H01L 21/67* (2006.01)

(52) U.S. Cl.
CPC .......... *H01L 23/3142* (2013.01); *H01L 21/50* (2013.01); *H01L 21/67011* (2013.01); *H01L 23/31* (2013.01); *H01L 25/0657* (2013.01)

(58) Field of Classification Search
CPC ................. H01L 25/0657; H01L 21/50; H01L 21/67011; H01L 21/56; H01L 21/656; H01L 21/568; H01L 21/566; H01L 21/67127; H01L 23/28; H01L 23/31; H01L 23/3142; H01L 2924/18301
See application file for complete search history.

(56) References Cited

U.S. PATENT DOCUMENTS

| | | | | |
|---|---|---|---|---|
| 5,635,220 A | * | 6/1997 | Izumi | ................ B29C 45/14655 |
| | | | | 264/272.17 |
| 6,472,729 B1 | * | 10/2002 | Oka | .................. H01L 23/49503 |
| | | | | 257/676 |
| 9,679,834 B2 | * | 6/2017 | Kwang | .................... H01L 24/32 |
| 9,696,898 B2 | * | 7/2017 | Matas | .................... G06F 3/0488 |
| 11,037,853 B1 | * | 6/2021 | Chan | ................... H01L 23/5385 |
| 2004/0140546 A1 | * | 7/2004 | Lee | ......................... H01L 24/33 |
| | | | | 257/686 |

(Continued)

OTHER PUBLICATIONS

Sharon Lim Pei-Siang, et al., "Characterization of DAF tape for Embedded micro wafer level package", 2009, 11th Electronics Packaging Technology Conference.

(Continued)

*Primary Examiner* — Eduardo A Rodela
(74) *Attorney, Agent, or Firm* — Patterson & Sheridan, LLP; Steven H. Versteeg

(57) ABSTRACT

A process includes forming one or more apertures on a component backside, creating a vacuum in a mold chase, and engaging the component backside with a mold compound in the mold chase. The one or more apertures form an aperture structure. The aperture structure may include multiple apertures parallel or orthogonal to each other. The apertures have an aperture width, aperture depth, and aperture pitch. These characteristics may be altered to minimize the likelihood of trapped air remaining after creating the vacuum in the mold chase.

8 Claims, 7 Drawing Sheets

(56) References Cited

U.S. PATENT DOCUMENTS

| | | | |
|---|---|---|---|
| 2006/0063283 A1* | 3/2006 | Cobbley | H01L 25/50 |
| | | | 438/14 |
| 2008/0070333 A1* | 3/2008 | Morita | B29C 33/68 |
| | | | 438/26 |
| 2010/0052149 A1* | 3/2010 | Nose | H01L 23/49503 |
| | | | 257/692 |
| 2011/0272824 A1* | 11/2011 | Pagaila | H01L 21/565 |
| | | | 257/777 |
| 2013/0105963 A1* | 5/2013 | Choi | H01L 24/92 |
| | | | 257/706 |
| 2013/0228930 A1* | 9/2013 | Ono | H01L 23/49866 |
| | | | 257/762 |
| 2014/0353817 A1* | 12/2014 | Konchady | H01L 27/16 |
| | | | 257/713 |
| 2015/0348946 A1* | 12/2015 | Dohi | H01L 23/3128 |
| | | | 257/773 |
| 2016/0254251 A1* | 9/2016 | Bae | H01L 23/49838 |
| | | | 257/698 |
| 2016/0276313 A1* | 9/2016 | Kume | H01L 25/0657 |
| 2017/0040308 A1 | 2/2017 | Ko | |
| 2017/0229403 A1 | 8/2017 | Jeng et al. | |
| 2019/0355674 A1* | 11/2019 | Farison | H01L 24/48 |

OTHER PUBLICATIONS

Sujay Singh, et al., "Effects of Die-Attach Voids on the Thermal Impedance of Power Electronic Packages", 2017, IEEE Transaction on Components, Packaging and Manufacturing Technology.

Yeging Su, et al., "Effect of Transfer Pressure on Die Attach Film Void Performance", 2009, 11th Electronics Packaging Technology Conference.

* cited by examiner

APERTURE STRUCTURE ON SEMICONDUCTOR COMPONENT BACKSIDE TO ALLEVIATE DELAMINATION IN STACKED PACKAGING

PRIORITY CLAIM AND CROSS-REFERENCE TO RELATED APPLICATIONS

This application claims priority, under 35 USC § 111(a), to Chinese Patent Application No. 201910312217.9, filed on Apr. 18, 2019, titled "APERTURE STRUCTURE ON SEMICONDUCTOR COMPONENT BACKSIDE TO ALLEVIATE DELAMINATION IN STACKED PACKAGING", in the Chinese Patent Office, the entirety of which is incorporated herein by reference.

BACKGROUND

De-lamination occurs in a semiconductor device when air, or other gases, are trapped in an atmospherically sealed region of the semiconductor device. De-lamination may occur during the process of mounting a component attach film onto a silicon wafer, for example. De-lamination impedes heat dissipation resulting in operational hot spots in semiconductor package devices, which may lead to thermal runaway during operation of the devices. Thermal runaway is among the major failure mechanisms of semiconductor packages. The impact of de-lamination on thermal dissipation may be quantified by junction-to-case thermal resistance analysis, which shows that electrical resistance values increase with an increase in de-lamination.

Failure analysis, cross-section analysis, and scanning electron microscope analysis may be utilized to identify de-lamination locations, such as at inter-component junctions and at component-to-substrate junctions. De-lamination may be detected using a scanning acoustic microscope in a thru-scan mode of operation. Any detected de-lamination may appear as a darkened area in the resulting images because ultrasound signals fail to pass through the atmospherically isolated air pockets.

Conventional techniques for addressing de-lamination may reduce the area of atmospherically isolated air, but do not eliminate these regions entirely. Bonding force, bonding time, and bonding temperature, after curing of the component attachment, may all have an impact on de-lamination. The molding process utilized may also affect de-lamination reduction by enhancement of process pressures. Further techniques, such as altering the components themselves, may minimize de-lamination.

BRIEF DESCRIPTION OF THE SEVERAL VIEWS OF THE DRAWINGS

To easily identify the discussion of any particular element or act, the most significant digit or digits in a reference number refer to the figure number in which that element is first introduced.

DETAILED DESCRIPTION

Figure 1:
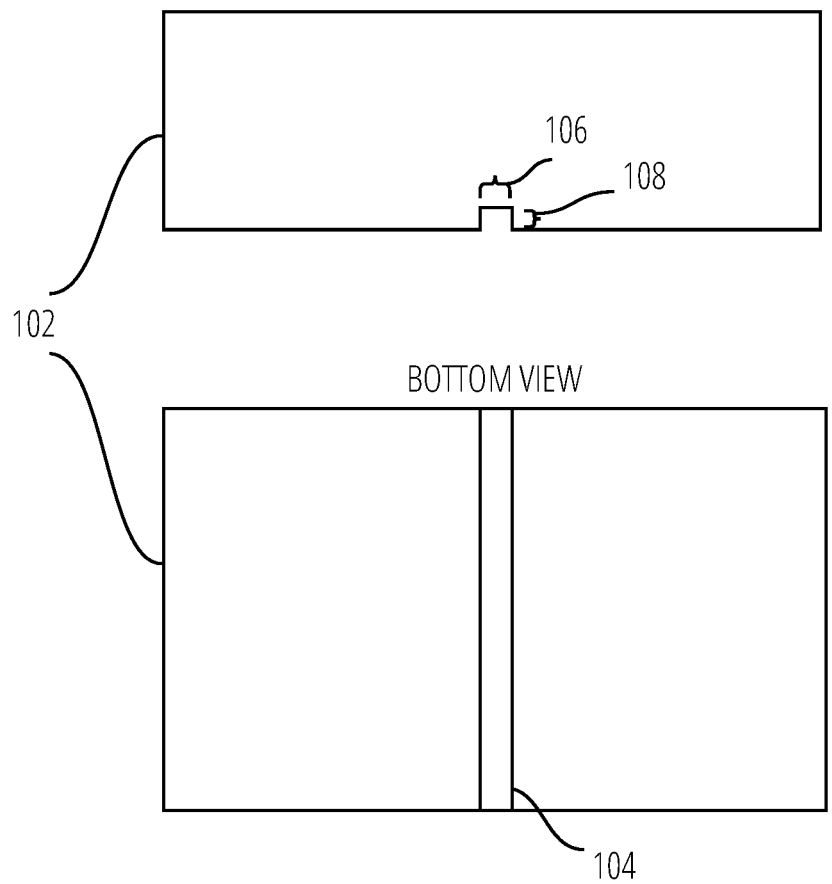
FIG. 1 illustrates aperture configurations in accordance with one embodiment.

FIG. 1 depicts a single aperture component 102 is in a cross-section view and a bottom (backside) view. The single aperture component 102 includes an aperture 104 having an aperture width 106 and an aperture depth 108. The single aperture component 102 may be any electronic component that is later bonded onto another component, for example a memory die.

The single aperture component 102 includes a component topside and a component backside. The topside may include semiconductor components. The aperture 104 is etched into the component backside. Various etching techniques may be utilized including laser etching, chemical etching, physical etching (e.g., by a diamond-tipped etching device), etc. As depicted, the aperture 104 bisects the single aperture component 102. The component backside comprises a width determined by a first set of opposing edges and a length determined by a second set of opposing edges and the width is less the length. The aperture 104 bisects the component backside and extends from the first set of opposing edges. Gases, if trapped, could be trapped in the middle of the component, therefore a configuration with the aperture 104 may be utilized. However, gases may be trapped in other areas, such as areas corresponding to a semiconductor component on the topside. Thus, in some embodiments, the aperture 104 may not bisect the single aperture component 102. During production, the etching device may be controlled to locate the aperture 104 to minimize de-lamination, based on for example topside features or learning based on post-manufacture testing or use.

As depicted, the aperture 104 extends from the midpoint of each of the first set of opposing edges. The first set of opposing edges are selected to minimize the length of the aperture 104. Such an aperture configuration may be selected to minimize the distance a pocket of gas may travel during a vacuum process to increase the likelihood of removing the trapped gas. Other embodiments may utilize other aperture configurations, including a diagonal aperture, an aperture extending from one edge to an adjacent edge, an aperture extending from the second set of opposing edges, etc. The aperture 104 has the aperture width 106 and the aperture depth 108. The aperture width 106 may be about 10 µm to about 20 µm. The aperture depth 108 may be about 3 µm.

Figure 2:
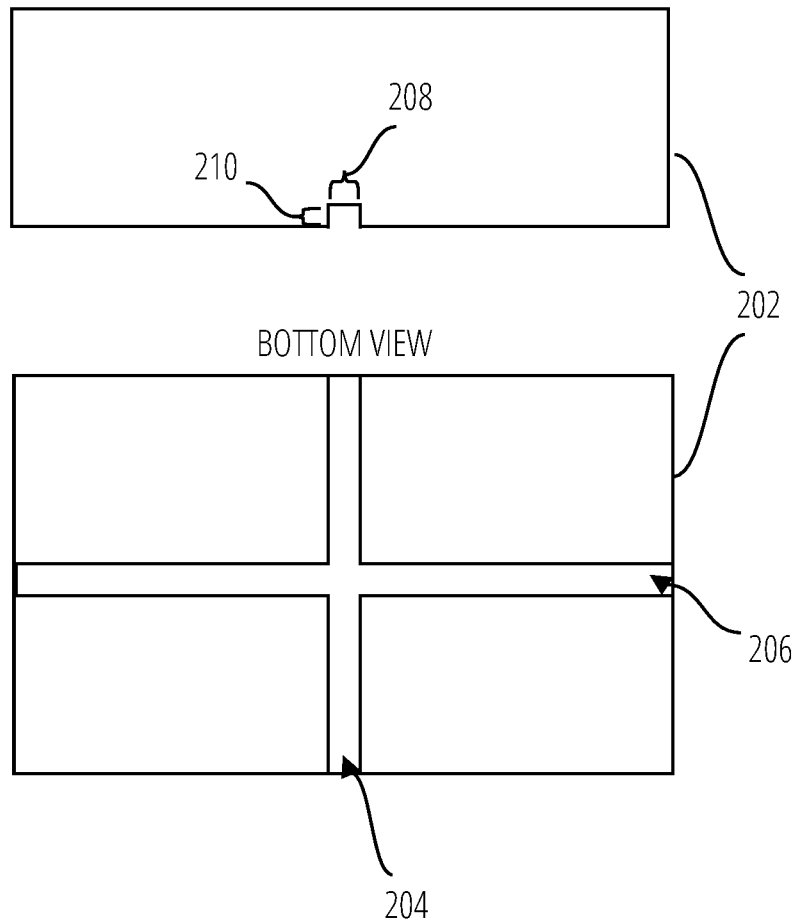
FIG. 2 illustrates aperture configurations in accordance with one embodiment.

FIG. 2 depicts a component with component with orthogonal apertures 202 in a cross-section view and a bottom (backside) view. An orthogonal aperture 206 and orthogonal aperture 204 are formed on the component backside. Various etching techniques may be utilized to form the apertures including laser etching, chemical etching, physical etching (e.g., by a diamond-tipped etching device), etc. As depicted, the orthogonal aperture 204 and the orthogonal aperture 206 each bisect the backside of the component with orthogonal apertures 202. The orthogonal aperture 204 bisects the component backside and extends from the first set of opposing edges, and the orthogonal aperture 206 bisects the component backside and extends from the second set of opposing edges. Generally, whether parallel to the width or length of the component backside, the apertures run continuously from one edge of the component backside to the other.

In some embodiments, one or both of the orthogonal aperture 204 and orthogonal aperture 206 may not bisect the component backside. During production, the etching device may be altered to locate the apertures to minimize delamination. As depicted, the orthogonal aperture 204 and orthogonal aperture 206 each extend from the midpoint of each of the first set and the second set of the opposing edges, respectively. Such an aperture configuration may be selected to minimize the distance a pocket of gas may travel during a vacuum process to increase the likelihood of removing the trapped air. Other embodiments may utilize other aperture configurations, including diagonal apertures, apertures extending from one edge to an adjacent edge, etc.

As depicted the orthogonal aperture 204 and orthogonal aperture 206 each have the aperture width 208 and the aperture depth 210. However in some embodiments the aperture width 208 and aperture depth 210 may be different for the orthogonal aperture 204 and the orthogonal aperture 206. The aperture width 208 may be about 10 μm to about 20 μm. The aperture depth 210 may be about 3 μm.

Figure 3:
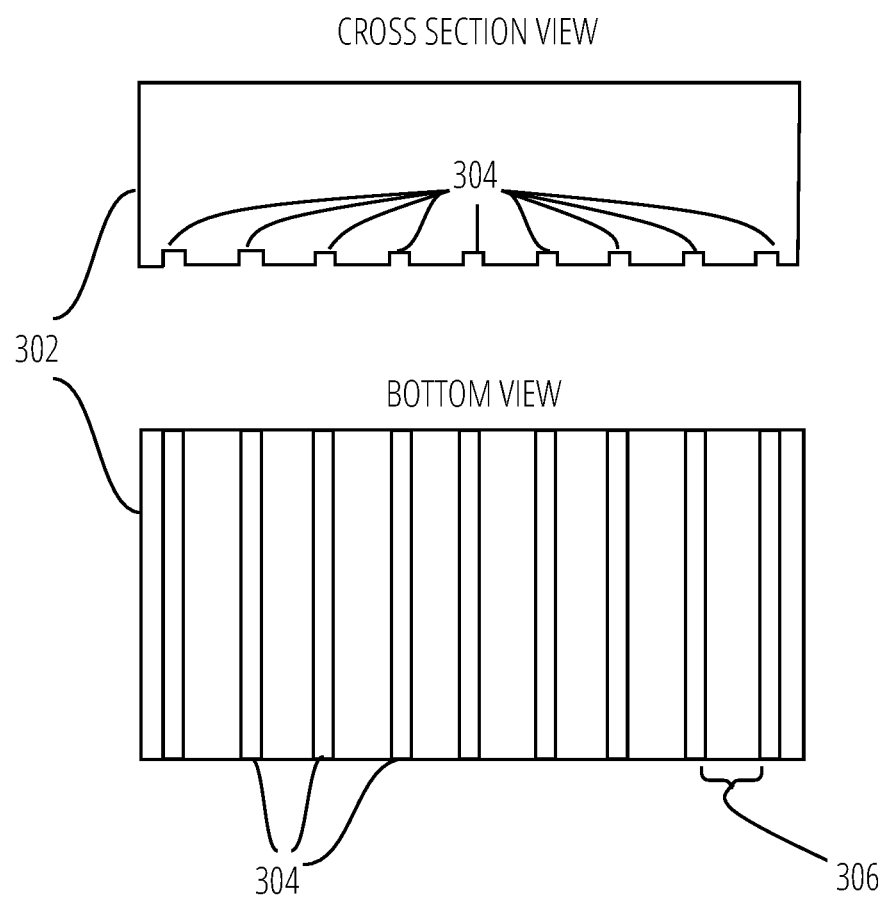
FIG. 3 illustrates aperture configurations in accordance with one embodiment.

FIG. 3 depicts a component with multiple parallel apertures 302 in a cross-sectional and bottom (backside) view. The component with multiple parallel apertures 302 includes parallel apertures 304 formed at a constant or variable aperture pitch 306. Each of the parallel apertures 304 has an aperture width and an aperture depth, as described previously. In some cases this width and depth may be the same of all of the parallel apertures 304, and in other cases some or all of the parallel apertures 304 may have a different aperture width and/or aperture depth. The aperture width may be about 10 μm to about 20 μm and may decrease toward the edges of the component (e.g., wider apertures near the center of the component backside).

The aperture pitch 306 is the distance between each of the parallel apertures 304. The aperture pitch 306 may be about 100 μm to about 1 mm. The aperture pitch 306 may be uniform across the component with multiple parallel apertures 302 or may vary. For example the aperture pitch 306 may me narrower (may lessen) near the center of the component backside.

The aperture structure may depend on surface features one the component topside, or of the component/substrate below in a component stack. Air pockets may form anywhere but may form more often in the center region of the component backside. In one embodiment, a more finely pitched array of apertures (and/or wider slots) may be etched across the center region to improve the venting of potential trapped air in this region. For example, the aperture pitch 306 may be lesser at the center of the component backside than toward the edges. Such a lesser aperture pitch 306 creates a finer, or higher density, aperture structure at the center of the component backside. As described previously, other embodiments of the component with multiple parallel apertures 302 may utilize other aperture configurations, including diagonal apertures, apertures extending from one edge to an adjacent edge, apertures extending from opposing edges that result in a greater aperture length, etc.

Figure 4:
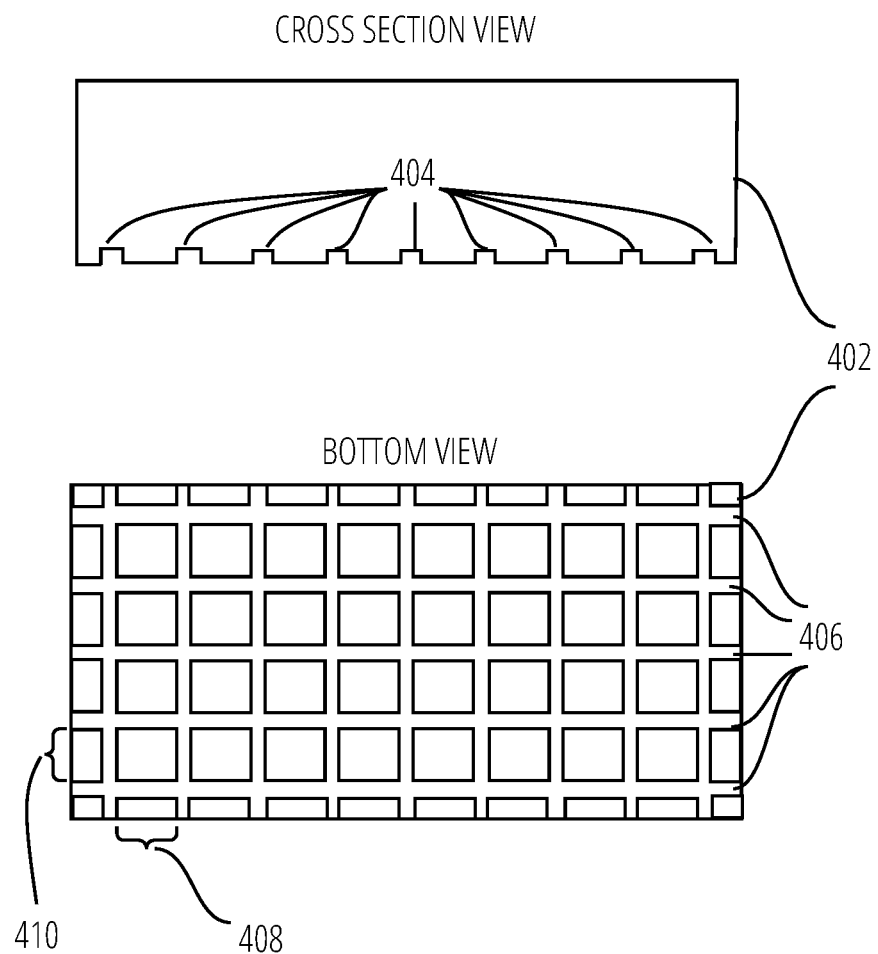
FIG. 4 illustrates aperture configurations in accordance with one embodiment.

FIG. 4 depicts a component with aperture matrix 402 in a cross-sectional bottom (backside) views. The component with aperture matrix 402 includes first parallel apertures 404 formed at a first aperture pitch 408 and second parallel apertures 406, orthogonal to the first parallel apertures 404, at a second aperture pitch 410.

As described previously for other embodiments, the aperture width and depth may be the same of all of the first parallel apertures 404 and/or second parallel apertures 406, and in other cases some or all of the apertures may have a different width and/or depth. The aperture width may be about 10 μm to about 20 μm and may decrease toward the edges of the component (e.g., wider apertures near the center of the component backside). The first aperture pitch 408 and/or second aperture pitch 410 may be about 100 μm to about 1 mm. Either pitch may be uniform across the component backside or may vary. The aperture structure may depend on surface features one the component topside, or of the component/substrate below in a component stack. Air pockets may form anywhere but may form more often in the center region of the component backside. In one embodiment, a more finely pitched array of apertures (and/or wider slots) may be etched across the center region to improve the venting of potential trapped air in this region. For example, one or both of the first aperture pitch 408 and second aperture pitch 410 may be lesser at the center of the component backside than toward the edges. Other embodiments of the component with aperture matrix 402 may utilize other aperture configurations, including diagonal apertures, apertures extending from one edge to an adjacent edge, apertures extending from opposing edges that result in a greater aperture length, etc.

Figure 5:
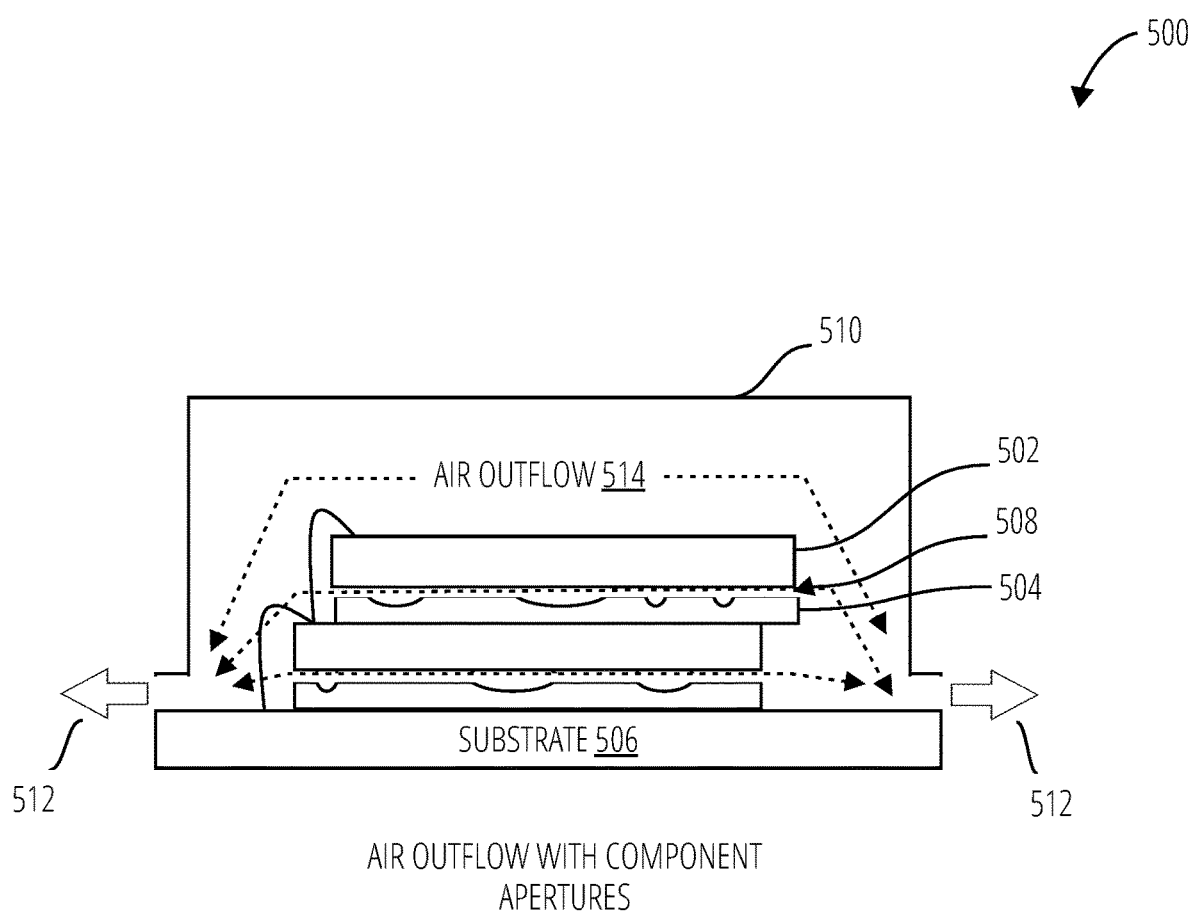
FIG. 5 illustrates a molding apparatus 500 in accordance with one embodiment.

FIG. 5 illustrates a molding apparatus 500 for a component 502 in one embodiment. The component 502 may be, for example, a memory die include semiconductor components on its topside. The component is formed into a stack or package on a substrate 506 along with zero or more other components. A component attach film 504 may be mounted to the component backside of each component 502. This may occur prior to slicing of the semiconductor wafer from which the component 502 is obtained. The component attach film 504 is thus located between each component of the stack, as well as between a component and the substrate 506, after component attachment (e.g., stacking as depicted). The component 502 may then be electrically coupled via bonding wires or other methods known in the art. Due to irregularities in the interface between the component 502 and the component attach film 504, atmospherically isolated air may tend to form between a backside of the component 502 and the component attach film 504. In some cases such atmospherically isolated air may also tend to occur between the component attach film 504 and the substrate 506. An aperture structure may thus be included on the topside of the substrate 506 in some cases.

An aperture structure formed on the component backside may vent atmospherically isolated air (or other gas) under bonding forces during component attachment. During the molding process in the mold chase 510 and prior to filling the semiconductor package with mold compound, the vacuum 512 may be generated in the mold chase 510 to vent air out of the mold chase 510. The aperture structure 508, such as one of the embodiments previously described, interlinks regions of the semiconductor package that may have atmospherically isolated air with the airflow 514 inside of mold chase 510. Thus, when the vacuum 512 is applied to the mold chase 510, the vacuum 512 is also applied to the atmospherically isolated air driving it from the inter-component regions. The vacuum 512 may, for example, be lower than the process pressure. In one embodiment, the vacuum 512 is about 1.0 torr. The vacuum 512 may be applied for about 5 s. In one embodiment, the drawdown of pressure from ambient pressure to about 01.0 Torr is about 5 s. Furthermore, the process temperature may be about 175 degrees C. Adding each component to the component stack may take about 400 ms to about 1 s. This process includes pressing into a mold compound and adding, for example, bonding wires (i.e., the electrical connections between components).

Figure 6:
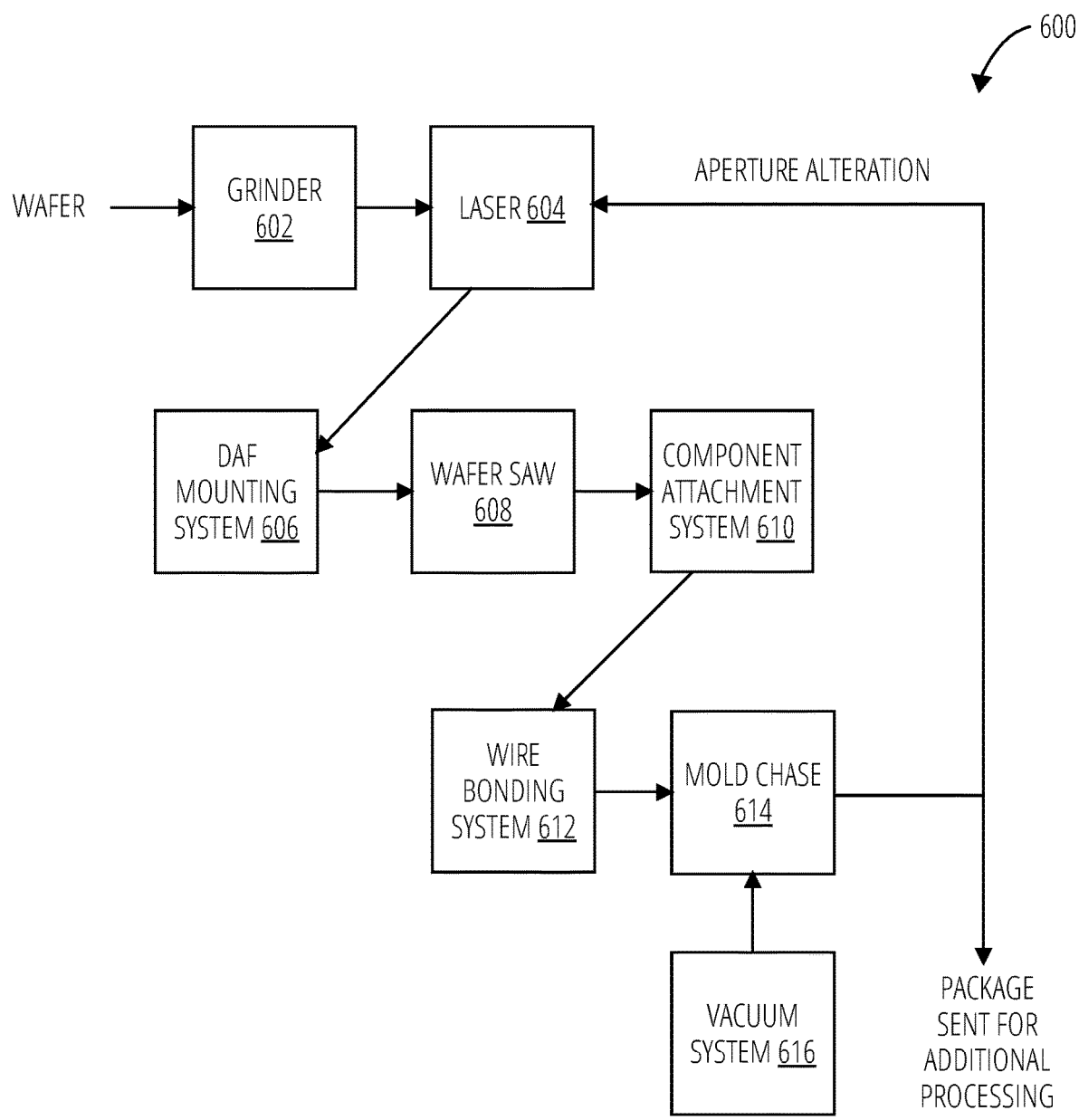
FIG. 6 illustrates a semiconductor package fabrication system 600 in accordance with one embodiment.

FIG. 6 illustrates an embodiment of a semiconductor package fabrication system 600 comprising a grinder 602, a laser 604, a component attach film mounting system 606, a wafer saw 608, a component attachment system 610, a wire bonding system 612, a mold chase 614, and a vacuum system 616.

The grinder 602 receives the wafer. The wafer may be a silicon wafer. The silicon wafer may be pre-fabricated with the semiconductor package components on the topside. The grinder 602 then grinds the wafer backside (and thus the component backsides) to prepare the wafer for the component attach film.

The laser 604 etches an aperture structure on the backside of the wafer. The laser 604 may move relative to the wafer, the wafer may be moved relative to the laser 604, or both to etch the aperture structure onto the wafer. As the wafer may be utilized to form multiple components, multiple aperture structures may be etched into the backside of the wafer. The laser 604 may receive an aperture alteration, such as a control signal, to modify the aperture structure being embedded into the wafer. The aperture alteration may add apertures; alter the location of the aperture; alter the aperture width, the aperture depth, or the aperture pitch; etc. In one embodiment, the laser 604 operates at a power of about 2 W, a frequency of about 40 kHz, and a speed of about 200 mm/s. In other embodiments, a chemical etching device or a physical etching device (e.g., a diamond-tipped etching device) may be utilized to etch the apertures into the wafer.

The component attach film mounting system 606 mounts the component attach film to the wafer. The component attach film mounting system 606 may be a source of the trapped air (or other gas).

The wafer saw 608 dices the wafer into the components. The wafer saw 608 may receive instructions regarding where the cuts are to be made to the wafer to form the components.

The component attachment system 610 adds each component to the semiconductor package. Each component may be added to a substrate, stacked onto another component, etc. This may include pressing the component onto the mold compound. Adding a component to the stack may take about 400 ms to about 1 s. This process may be performed by a robotic system.

The wire bonding system 612 attaches bonding wires to the substrate and the components. The bonding wires form the electrical couplings for the semiconductor package. The addition of the bonding wires may be included in the time to stack the components.

The mold chase 614 adds the mold compound to the semiconductor package. During this process, the component backside engages with a mold compound in the mold chase 614. The mold chase 614 is also coupled to the vacuum system 616. The mold chase 614 and the vacuum system 616 together create a system to remove trapped air from between the components (e.g., a component and its component attach film). The vacuum system 616 draws a vacuum on the mold chase 614 and may drawdown the pressure from ambient pressure to about 1.0 Torr in about 5 s. The process temperature may be about 175 degrees C.

The semiconductor package is then sent for additional processing. The additional processing may include determining the effectiveness of the aperture structures utilized. Ineffective aperture structures may be altered by sending an aperture alteration control signal to the laser 604, or other component controlling the wafer relative to the laser 604. An ineffective aperture structure may be an aperture structure that results in a number of failures exceeding a threshold amount. The laser 604, or other component controlling the wafer relative to the laser 604, may also be altered utilizing other inputs, as well.

Figure 7:
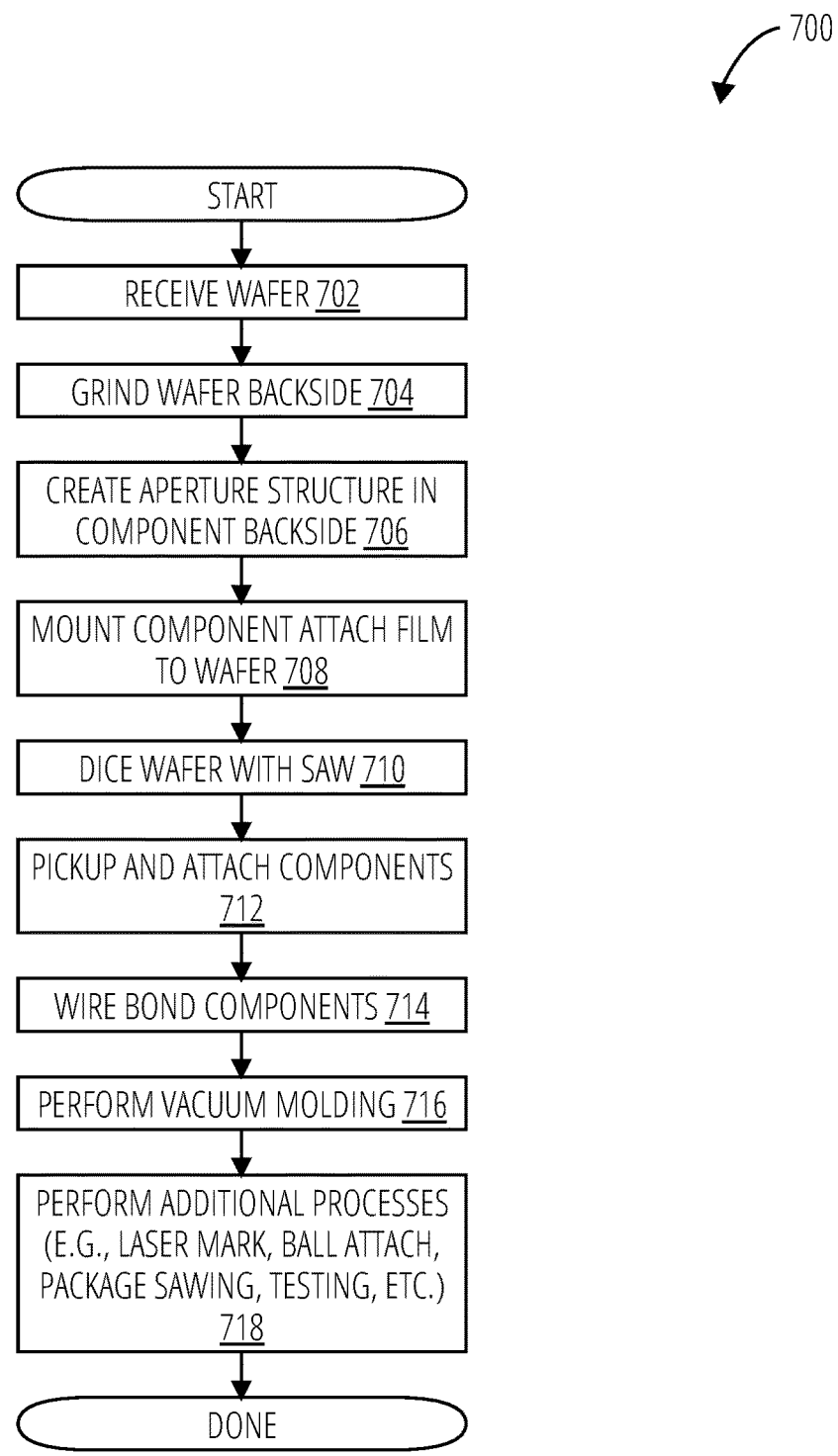
FIG. 7 illustrates a semiconductor package fabrication process 700 in accordance with one embodiment.

The semiconductor package fabrication system 600 may be operated in accordance with the process depicted in FIG. 7.

Referring to FIG. 7, a semiconductor package fabrication process 700 in one embodiment first receives a wafer (block 702). The wafer may be a fabricated semiconductor silicon wafer. The backside of the wafer is then ground (block 704). As the wafer is divided into multiple components, grinding the wafer backside grinds each component backside. An aperture structure is created in the component backside (block 706). As the wafer is diced into multiple components, creating an aperture structure on the wafer backside also creates the aperture structure on each component backside. Performing this step prior to wafer dicing may thus be more efficient. The aperture structure may be one of the aperture configurations depicted or discussed in reference to FIG. 1-FIG. 4.

The component attach film is mounted to the wafer (block 708), specifically to the wafer backside. This process is prone to introducing atmospherically isolated air (or other gases) between the wafer backside (and thus the component backside) and the component attach film. The wafer is then diced (block 710), for example using a die saw, into the individual components. Each component may have component attach film mounted and, thus, may have trapped air. Each component is picked up and attached (block 712). The component may be attached to a substrate or another component by stacking. Adding a component to the stack may take about 400 ms to about 1 s. Trapped air may further occur between the substrate and the component attach film of any component mounted to the substrate. In some embodiments, the substrate also has an aperture structure etched into it.

The components are then electrically coupled (block 714) e.g., using bonding wires that provide electrical coupling between the substrate and the components, as well as between components. The time to perform wire bonding may be include with the time to performed component attachment. Vacuum molding is performed (block 716). A vacuum may be drawn on a mold chase. The vacuum may draw the pressure down from ambient pressure to about 1.0 Torr in about 5 s. Mold compound is also introduced into the mold chase. During this process, the component backside engages with a mold compound in the mold chase. The process temperature may be about 175 degrees C. Additional processes may then be performed (block 718). The additional processes may include laser mark, ball attach, package sawing, testing, etc. The testing may result in an alteration to the aperture structure applied to subsequent wafers. The aperture structure may be altered based on the number of failures exceeding a threshold. Subsequent wafers may have more apertures; fewer apertures; an altered aperture location; a different aperture width, aperture depth, or aperture pitch, etc. For example, an initial wafer may be etched to have a single aperture on the resulting components. Such a wafer may still produce failures due to trapped air. The etching device may be controlled to produce multiple parallel apertures. These pitch for these apertures may be finer toward the center of the resultant components. Alternatively, the trapped may be correlated to a component on the topside of a component. The location of the aperture on the resultant components may be moved to correspond to the failure location to increase the likelihood that the trapped air is removed during the vacuum molding process. Other aperture structures may be utilized to minimize the likelihood of trapped air remaining during the vacuum molding process.

What is claimed is:

1. A semiconductor package, comprising:
a first semiconductor component having a backside portion positioned on a second semiconductor component; and
wherein the backside portion of the first semiconductor component includes one or more apertures to allow air to flow between the first semiconductor component and the second semiconductor component, wherein each aperture has an aperture width of between about 10 μm to about 20 μm, and wherein parallel apertures have an aperture pitch of between about 100 μm to about 1 mm.

2. The semiconductor package of claim 1, wherein the one or more apertures comprises a first set of multiple parallel apertures.

3. The semiconductor package of claim 2, wherein the first set of multiple parallel apertures have an aperture pitch, the aperture pitch being lesser toward a center of the backside portion.

4. The semiconductor package of claim 2, wherein the one or more apertures further comprises a second set of multiple parallel apertures orthogonal to the first set of multiple parallel apertures forming a matrix of apertures.

5. The semiconductor package of claim 1, wherein the backside portion comprises a component length longer than a component width, the one or more apertures comprising a first aperture bisecting the backside portion and extending from edge to edge across the component length.

6. A semiconductor package, comprising:
a first semiconductor component having a backside portion positioned on a second semiconductor component;
wherein the backside portion of the first semiconductor component includes one or more apertures to allow air to flow between the first semiconductor component and the second semiconductor component;
wherein the backside portion comprises a component length longer than a component width, the one or more apertures comprising a first aperture bisecting the backside portion and extending from edge to edge across the component length; and
wherein the one or more apertures further comprises a second aperture bisecting the backside portion and extending from edge to edge of the component width.

7. The semiconductor package of claim 6, wherein the first aperture and the second aperture are orthogonal apertures.

8. The semiconductor package of claim 6, wherein the first aperture and the second aperture are not orthogonal.

* * * * *